(12) United States Patent
Fujimura et al.

(10) Patent No.: US 9,337,559 B2
(45) Date of Patent: May 10, 2016

(54) PRINTED CIRCUIT BOARD, METHOD OF MANUFACTURING THE SAME AND CONNECTION TERMINAL

(71) Applicants: Yoshito Fujimura, Ibaraki (JP); Jun Ishii, Ibaraki (JP)

(72) Inventors: Yoshito Fujimura, Ibaraki (JP); Jun Ishii, Ibaraki (JP)

(73) Assignee: NITTO DENKO CORPORATION, Ibaraki-shi, Osaka (JP)

(*) Notice: Subject to any disclaimer, the term of this patent is extended or adjusted under 35 U.S.C. 154(b) by 218 days.

(21) Appl. No.: 13/674,323

(22) Filed: Nov. 12, 2012

(65) Prior Publication Data

US 2013/0203294 A1    Aug. 8, 2013

Related U.S. Application Data

(60) Provisional application No. 61/601,266, filed on Feb. 21, 2012.

(30) Foreign Application Priority Data

Feb. 3, 2012    (JP) ................................. 2012-022233

(51) Int. Cl.
| | |
|---|---|
| H05K 1/03 | (2006.01) |
| H05K 1/09 | (2006.01) |
| H05K 1/11 | (2006.01) |
| H05K 7/10 | (2006.01) |
| H01R 12/00 | (2006.01) |
| H05K 3/06 | (2006.01) |
| H05K 1/05 | (2006.01) |
| G11B 5/48 | (2006.01) |

(52) U.S. Cl.
CPC .................. H01R 9/091 (2013.01); H05K 1/11 (2013.01); H05K 1/111 (2013.01); G11B 5/484 (2013.01); G11B 5/4853 (2013.01); H05K 1/056 (2013.01); H05K 3/061 (2013.01); Y02P 70/611 (2015.11)

(58) Field of Classification Search
CPC ......... H01R 9/091; H05K 1/056; H05K 1/11; H05K 1/111; G11B 5/4853
USPC ........... 174/250, 255, 257, 261, 262; 361/767
See application file for complete search history.

(56) References Cited

U.S. PATENT DOCUMENTS

| | | | | |
|---|---|---|---|---|
| 5,328,751 | A * | 7/1994 | Komorita et al. | 428/209 |
| 5,986,218 | A * | 11/1999 | Muto et al. | 174/261 |
| 6,399,899 | B1 | 6/2002 | Ohkawa et al. | |
| 6,504,110 | B1 * | 1/2003 | Kusukawa et al. | 174/261 |
| 7,482,800 | B2 * | 1/2009 | Ooyabu et al. | 324/756.07 |

(Continued)

FOREIGN PATENT DOCUMENTS

| | | |
|---|---|---|
| JP | 08-283966 A | 10/1996 |
| JP | 09-297390 A | 11/1997 |

(Continued)

OTHER PUBLICATIONS

Office Action issued Jul. 14, 2015 in JP Application No. 2012022233.

*Primary Examiner* — Sherman Ng
(74) *Attorney, Agent, or Firm* — Panitch Schwarze Belisario & Nadel LLP

(57) ABSTRACT

A read wiring trace and a write wiring trace are formed on an insulating layer. Connection terminals made of conductor are connected to the read wiring trace and the write wiring trace, respectively. Each connection terminal has at least one corner with a radius of curvature of not larger than 35 μm.

7 Claims, 8 Drawing Sheets

(56) References Cited

U.S. PATENT DOCUMENTS

| | | | |
|---|---|---|---|
| 7,808,742 B2* | 10/2010 | Kamijima et al. | 360/125.02 |
| 2006/0023435 A1* | 2/2006 | Ooyabu et al. | 361/760 |
| 2009/0195998 A1* | 8/2009 | Ishimaru et al. | 361/761 |
| 2010/0193231 A1* | 8/2010 | Yamanaka et al. | 174/260 |
| 2010/0212947 A1* | 8/2010 | Yamanaka et al. | 174/260 |
| 2010/0277835 A1* | 11/2010 | Honjo et al. | 360/266.3 |
| 2011/0111264 A1* | 5/2011 | Hanazono | 429/7 |
| 2012/0113547 A1* | 5/2012 | Sugimoto | 360/245.8 |

FOREIGN PATENT DOCUMENTS

| | | |
|---|---|---|
| JP | 2001209918 A | 8/2001 |
| JP | 2009060000 A | 3/2009 |

\* cited by examiner

F I G. 2 (a)
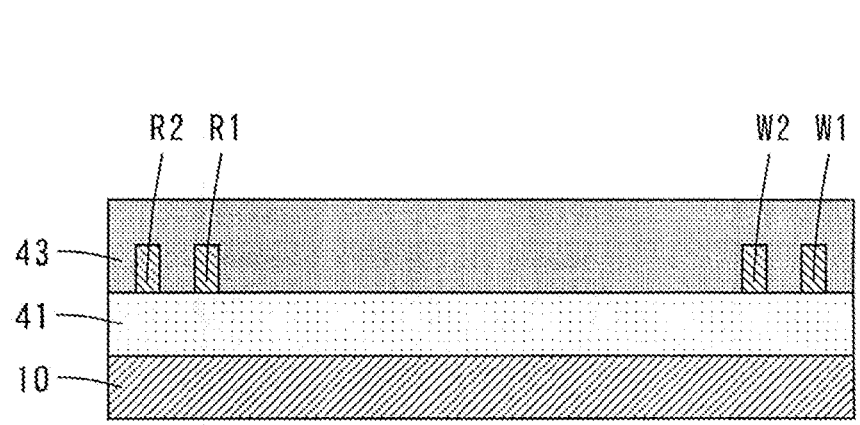
F I G. 2 (b)
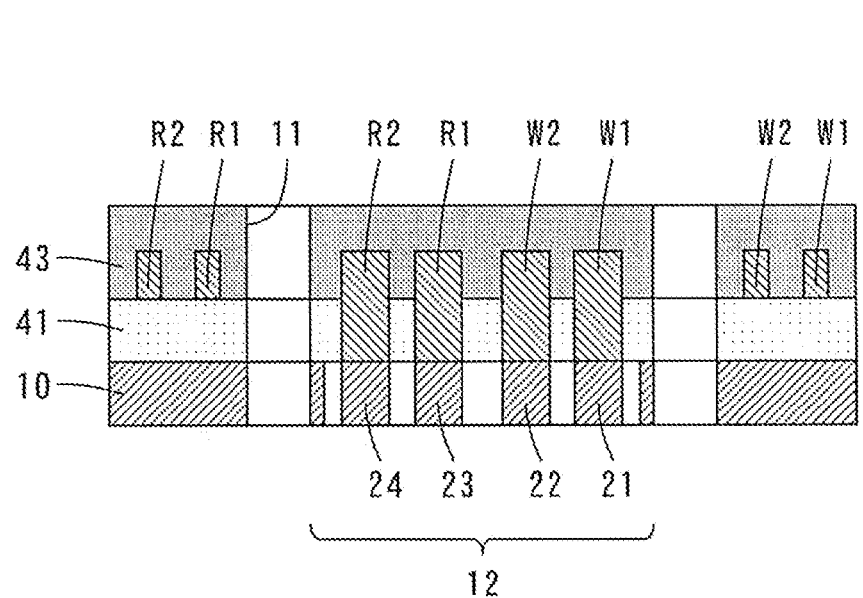

F I G. 7 (a)
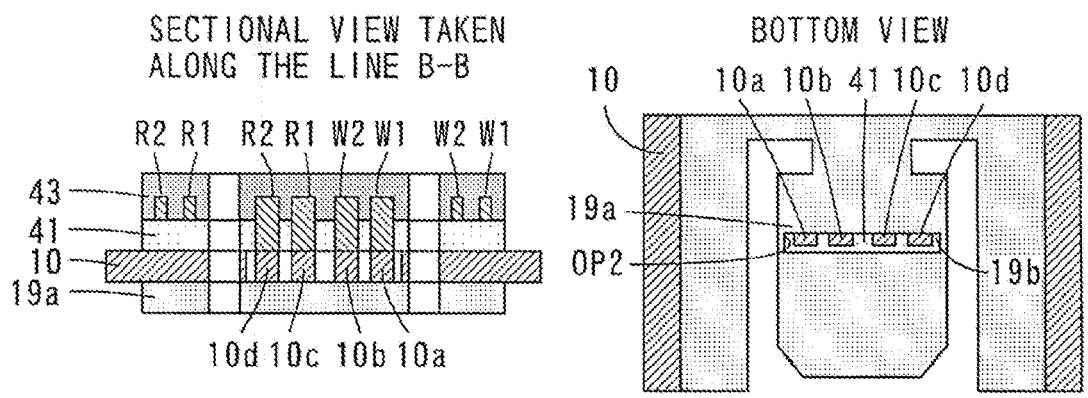
F I G. 7 (b)
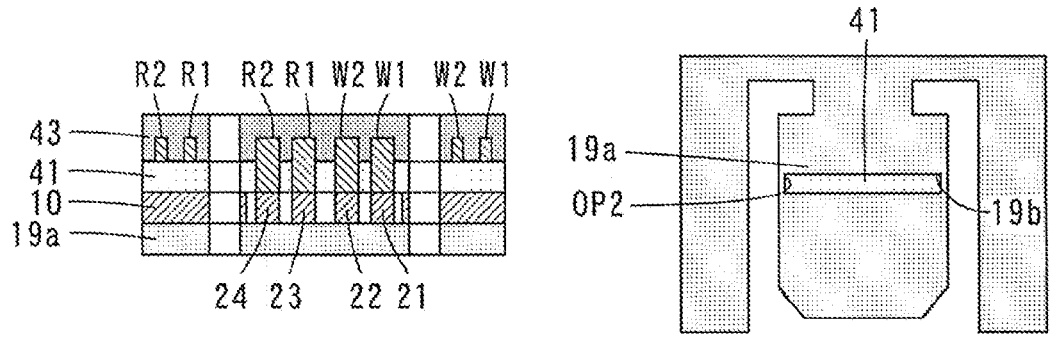
F I G. 7 (c)
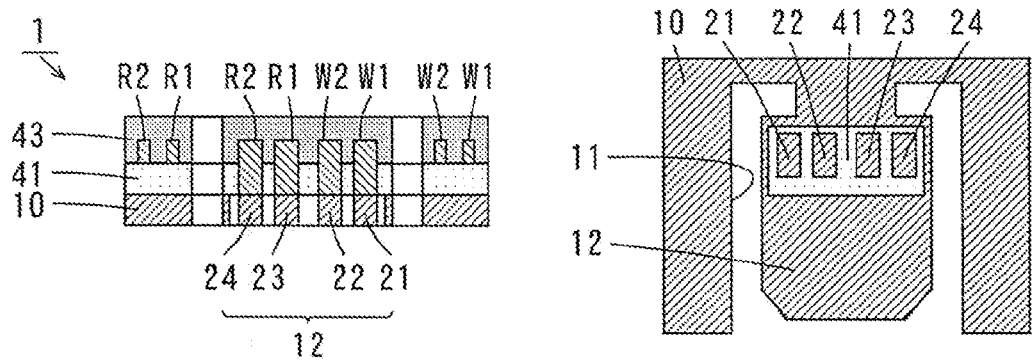

PRINTED CIRCUIT BOARD, METHOD OF MANUFACTURING THE SAME AND CONNECTION TERMINAL

BACKGROUND OF THE INVENTION (1) Field of the Invention

The present invention relates to a printed circuit board, a method of manufacturing the same and a connection terminal.

(2) Description of Related Art

Actuators are used in drives such as hard disc drives. Such an actuator includes an arm provided rotatably around a rotation shaft, and a suspension board with a circuit for a magnetic head that is attached to the arm. The suspension board with the circuit is a printed circuit board for positioning the magnetic head at a desired track of a magnetic disc.

Signal lines and connection terminals are formed on the suspension board with the circuit. A head slider including the magnetic head is attached on the connection terminals of the suspension board with the circuit. The magnetic head is electrically connected to another electronic circuit through the connection terminals and the signal lines on the suspension board with the circuit.

The connection terminals are manufactured by etching described below. (See, for example, JP 8-283966 A.) Resists are formed on both sides of a metal substrate. Then, a desired resist pattern is formed by selective exposure, development and drying, etc. Thereafter, part of the metal substrate that is exposed on the resist pattern is etched. Finally, the resist pattern is removed from the metal substrate after the completion of the etching, whereby a product with the desired pattern (connection terminals in this example) is obtained.

BRIEF SUMMARY OF THE INVENTION

When rectangular connection terminals are formed by the etching described above, roundness is generated on the corners of the connection terminals. In this case, the bonding areas of the connection terminals are reduced when an electronic component such as a head slider and the connection terminals are bonded to each other by a solder. In recent years, printed circuit boards have been made finer, and thus, the bond strength of the connection terminals and the other electronic components weakens since the bonding areas of the connection terminal are reduced. As a result, the connection reliability of the connection terminals deteriorates.

An object of the present invention is to provide a printed circuit board having a connection terminal in which connection reliability can be secured and which can be made finer, a method of manufacturing the printed circuit board, and such a connection terminal.

(1) According to an aspect of the present invention, a printed circuit board includes an insulating layer, a wiring trace formed on the insulating layer and a connection terminal made of conductor that is electronically connected to the wiring trace, wherein the connection terminal has at least one corner with a radius of curvature of not larger than 35 μm.

In the printed circuit board, the connection terminal made of conductor is electronically connected to the wiring trace on the insulating layer. The radius of curvature of at least one corner of the connection terminal is not larger than 35 μm. In this case, the corner is hardly rounded. Therefore, the reduction of the bonding area due to the roundness of the corner can be suppressed. As a result, the connection reliability of the connection terminal can be secured and the suspension board can be made finer.

(2) The conductor may include stainless steel and the radius of curvature of the at least one corner of the connection terminal may be not larger than 30 μm. In this case, the reduction of the bonding area of the connection terminal including stainless steel can be more sufficiently suppressed.

(3) The conductor may include copper and the radius of curvature of the at least one corner of the connection terminal may be not larger than 10 μm. In this case, the reduction of the bonding area of the connection terminal including the copper can be more sufficiently suppressed.

(4) The connection terminal may have first and second sides parallel to each other and a third side orthogonal to the first and second sides, and at least one corner includes a first corner that is formed by the first and third sides, and a second corner that is formed by the second and third sides.

In this case, the first and second corners are hardly rounded. Therefore, the reduction of the bonding area of the connection terminal can be further sufficiently suppressed.

(5) The width between the first and second sides may be not larger than 70 μm. In this case, the suspension board can be sufficiently made finer while the reduction of the bonding area of the connection terminal is suppressed.

(6) The connection terminal may be configured to be electrically connectable to a magnetic head and transmittable of an electric signal between the magnetic head and an electronic circuit through the wiring trace and the connection terminal.

In this case, the connection terminal and the magnetic head are electrically connected and the electric signal is transmitted between the magnetic head and the electronic circuit through the printed circuit board. Because the reduction of the bonding area of the connection terminal is suppressed, a weakening of bond strength of the connection terminal and the magnetic head is suppressed. As a result, the connection reliability between the connection terminal and the magnetic head can be improved.

(7) According to another aspect of the present invention, a method of manufacturing a printed circuit board includes the steps of forming a conductor trace that has a side extending in one direction on an insulating layer, forming a first etching resist on the insulating layer that has an edge crossing the side of the conductor trace and covers part of the conductor trace, and forming a connection terminal that has at least one corner by removing a portion of the conductor trace exposed on the first etching resist by etching.

In the method of manufacturing the printed circuit board, the conductor trace that has the side extending in one direction is formed on the insulating layer. The first etching resist that has the edge crossing the side of the conductor trace and covers part of the conductor trace is formed on the insulating layer. A portion of the conductor trace that is exposed on the first etching resist is removed by etching. As a result, the side that extends in another direction crossing the one direction mentioned above is formed on the conductor trace, and the connection terminal that has at least one corner is formed.

In this case, the corner is hardly rounded. Therefore, the reduction of the bonding area of the connection terminal due to the roundness of the corner can be suppressed. As a result, the printed circuit board can be made finer while the connection reliability of the connection terminal can be secured.

(8) A radius of curvature of the at least one corner of the connection terminal may be not larger than 35 μm. In this case, the reduction of the bonding area of the connection terminal due to the roundness of the corner can be suppressed. As a result, the printed circuit board can be made finer while the connection reliability of the connection terminal can be secured.

(9) The step of forming the conductor trace may include the steps of forming a second etching resist on the insulating layer that has an edge extending in the one direction to cover part of a conductor layer formed on the insulating layer, and forming the conductor trace by removing a portion of the conductor layer exposed on the second etching resist by etching.

In this case, the conductor trace that has the side extending in the one direction is formed by etching the conductor layer using the second etching resist, and the connection terminal that has at least one corner is formed by etching the conductor trace using the first etching resist. Thus, the connection terminal with hardly any roundness on its corner can easily be formed by two-time etching.

(10) The step of forming the conductor trace may include the step of forming the conductor trace that has the first and second sides parallel to each other, and the step of forming the first etching resist on the insulating layer may include the step of forming the first etching resist on the insulating layer that has an edge orthogonal to the first and second sides, the step of forming the connection terminal that has the at least one corner may include the step of forming the connection terminal that has a third side orthogonal to the first and second sides by removing a portion of the conductor trace exposed on the first etching resist by etching, and the at least one corner of the connection terminal may include a first corner formed by the first and third sides, and a second corner formed by the second and third sides.

In this case, the print circuit board that includes the connection terminal having the first and second corners is manufactured. The first and second corners of the connection terminal are hardly rounded. Therefore, the reduction of the bonding area of the connection terminal can be further sufficiently suppressed.

(11) According to a further aspect of the present invention, a connection terminal that is to be electrically connected to a wiring trace to transmit the electrical signal, comprising at least one corner having a radius of curvature of not larger than 35 μm.

In this connection terminal, the radius of curvature of at least one corner is not larger than 35 μm. In this case, the corner is hardly rounded. Therefore, the reduction of the bonding area of the connection terminal can be suppressed. As a result, the connection terminal can be made finer while the connection reliability of the connection terminal can be secured.

According to the present invention, it is possible to make the printed circuit board finer while securing the connection reliability of the connection terminal.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIGS. 2 (*a*) and 2 (*b*) are cross-sectional views of the suspension board illustrated in FIG. 1;

FIGS. 7 (*a*) to 7(*c*) are diagrams showing the steps of manufacturing a suspension board according to a second embodiment;

DESCRIPTION OF THE PREFERRED EMBODIMENTS

[1] First Embodiment

A printed circuit board with connection terminals according to the first embodiment of the present invention and a method of manufacturing the same will be described below with reference to the drawings. A suspension board used for an actuator in a hard disc drive as the printed circuit board according to the first embodiment of the present invention will be described below.

(1) Configuration of Suspension Board

Figure 1:
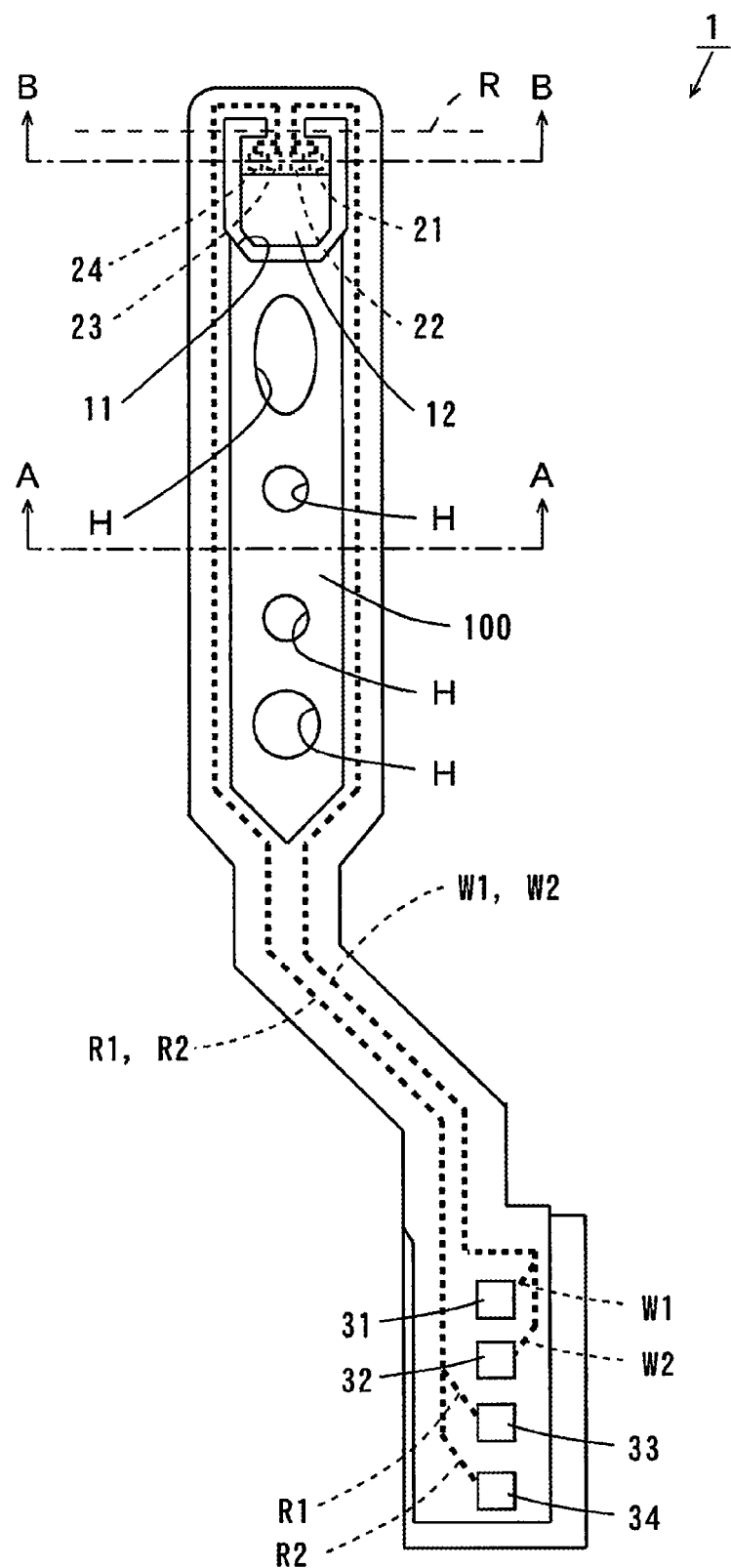
FIG. 1 is a top view of a suspension board according to a first embodiment of the present invention.

FIG. 1 is a top view of the suspension board according to the first embodiment of the present invention. As shown in FIG. 1, a suspension board 1 includes a suspension body 100 formed of a metallic and elongate support substrate. Write wiring traces W1 and W2 and read wiring traces R1 and R2, as shown by thick dotted lines, are formed on the suspension body 100. The write wiring trace W1 and the write wiring trace W2 constitute a signal line pair. The read wiring trace R1 and the read wiring trace R2 constitute a signal line pair.

At one end of the suspension body 100, a magnetic head supporting portion (hereinafter referred to as a tongue) 12 is provided by forming a U-shaped opening 11. The tongue 12 is bent along a broken line R to form a predetermined angle with respect to the suspension body 100. On the lower surface of the tongue 12 at one end of the suspension body 100, four connection terminals 21, 22, 23 and 24 are formed. A head slider that includes a magnetic head is attached to the connection terminals 21 to 24 on the lower surface of the tongue 12.

In the present embodiment, each of the connection terminals 21 to 24 has a rectangular shape. The width of each of the connection terminals 21 to 24 (the width between sides L1 and L2 of FIG. 6, described later) is preferably not larger than 70 μm. In this case, the suspension board 1 can be made finer and smaller.

Four connection terminals 31, 32, 33 and 34 are formed on the upper surface of the other end of the suspension body 100. An electronic circuit such as a preamplifier is connected to the connection terminals 31 to 34. The connection terminals 21 to 24 of the tongue 12 and the connection terminals 31 to 34 of the other end of the suspension body 100 are electrically connected by the write wiring traces W1 and W2 and the read wiring traces R1 and R2, respectively. Further, a plurality of holes H are formed in the suspension body 100.

The suspension board 1 is provided in a hard disc device. An electric current flows through the pair of the write wiring traces W1 and W2 at the time of writing information into a magnetic disc. Further, the electric current flows through the pair of the read wiring traces R1 and R2 at the time of reading information from the magnetic disc.

Next, the connection terminals 21 to 24 of the suspension board 1 and its peripheral portions will be described in detail below. FIG. 2 is a cross-sectional view of the suspension board 1 of FIG. 1. FIG. 2 (a) shows a cross sectional view taken along the line A-A of the suspension board 1 of FIG. 1, and FIG. 2 (b) shows a cross sectional view taken along the line B-B of the suspension board 1 of FIG. 1.

As shown in FIG. 2 (a), an insulating layer 41 made of polyimide, for example, is formed on a metallic support substrate 10 made of stainless steel, for example. The write wiring traces W1 and W2 and the read wiring traces R1 and R2 are spaced apart from and parallel to each other on the insulating layer 41. The write wiring traces W1 and W2 extend along one lateral side of the insulating layer 41 and the read wiring traces R1 and R2 extend along the other lateral side of the insulating layer 41. A cover layer 43 made of polyimide, for example, is formed on the insulating layer 41 to cover the write wiring traces W1 and W2 and the read wiring traces R1 and R2.

The write wiring traces W1 and W2 and the read wiring traces R1 and R2 that extend along the one lateral side and the other lateral side of the insulating layer 41 bend inward at one end of the suspension body 100 of FIG. 1, and bend towards the tongue 12, and then extend to the tongue 12 as shown in FIG. 2 (b). The write wiring traces W1 and W2 and the read wiring traces R1 and R2 on the tongue 12 are respectively connected to the connection terminals 21 to 24 on the lower surface of the tongue 12.

(2) Method of Manufacturing the Suspension Board

Figure 3:
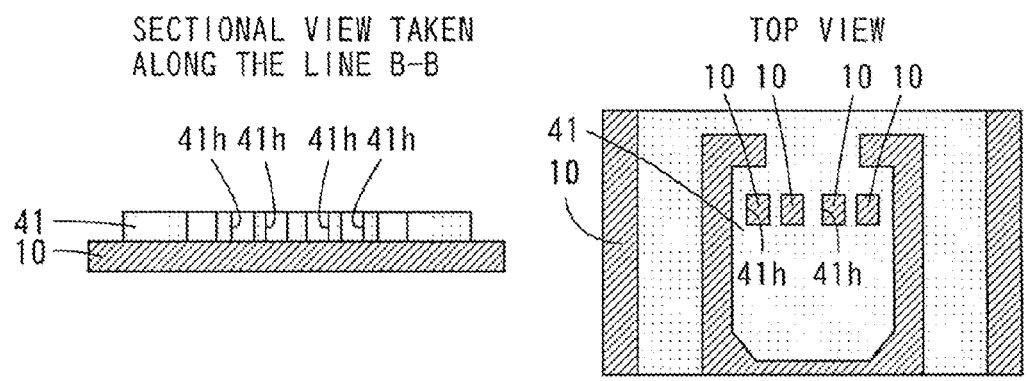
FIGS. 3 (*a*) to 3(*c*) are diagrams showing the steps of manufacturing the suspension board illustrated in FIG. 1.
Figure 3:
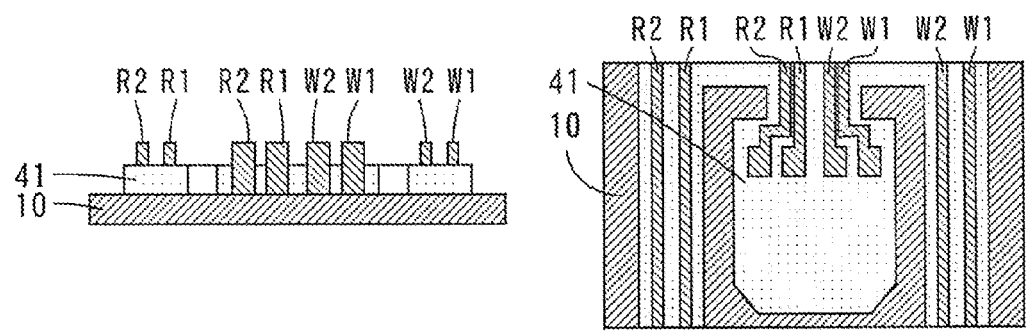
Figure 3:
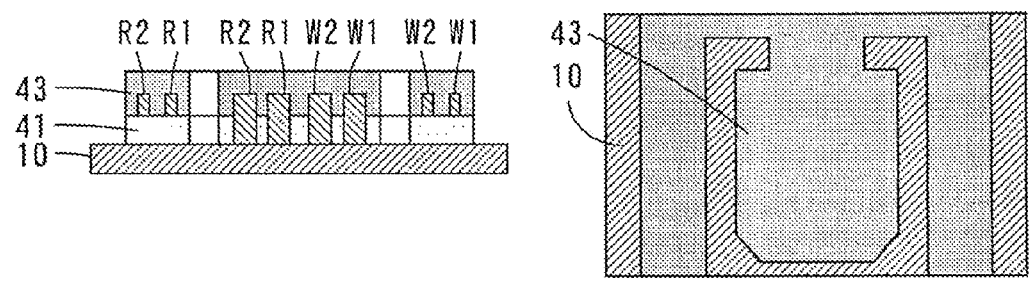
Figure 4:
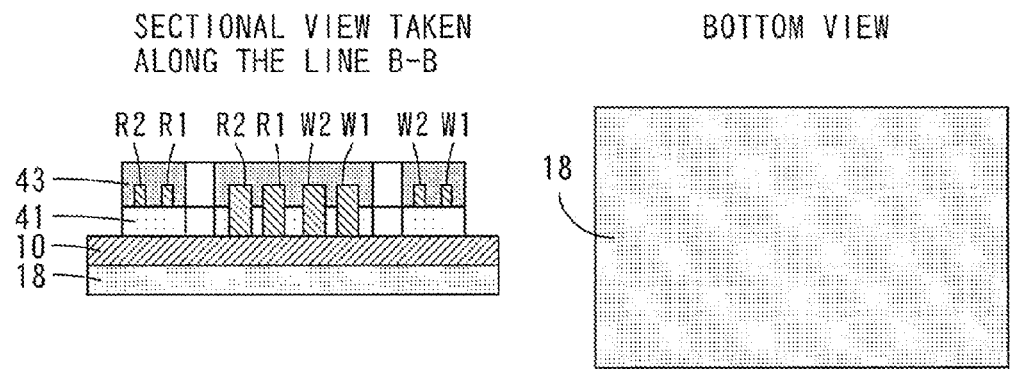
FIGS. 4 (*a*) to 4(*d*) are diagrams showing the steps of manufacturing the suspension board illustrated in FIG. 1.
Figure 4:
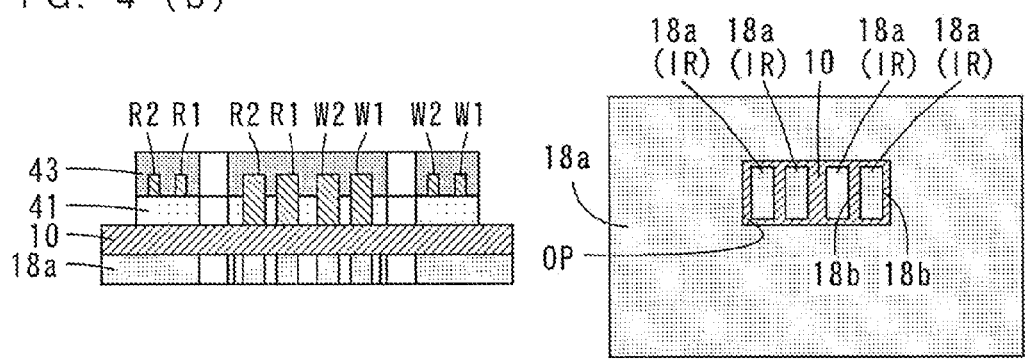
Figure 4:
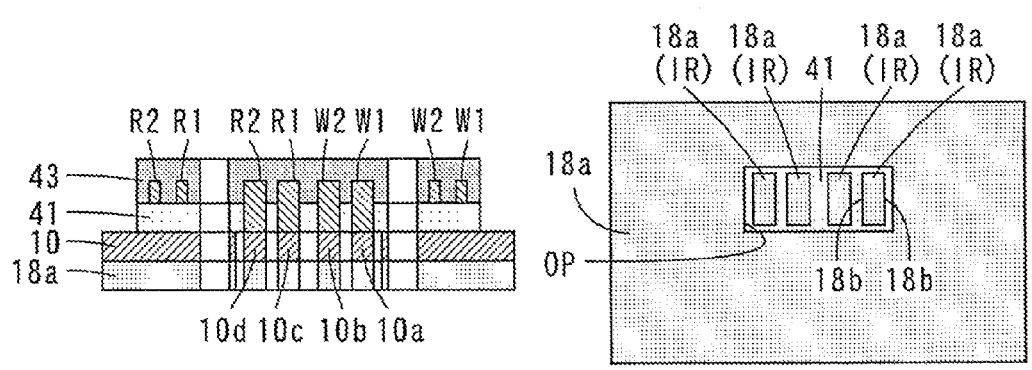
Figure 4:
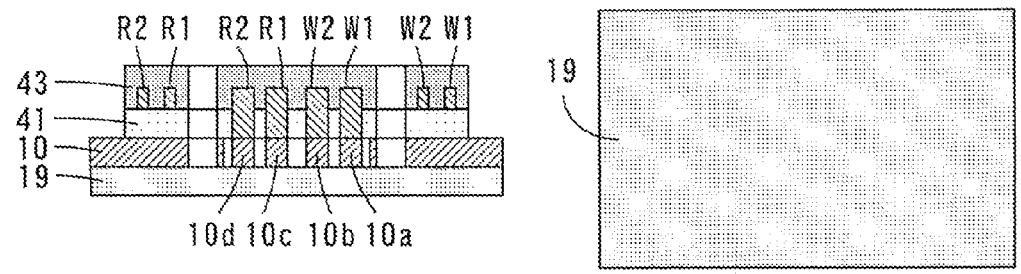
Figure 5:
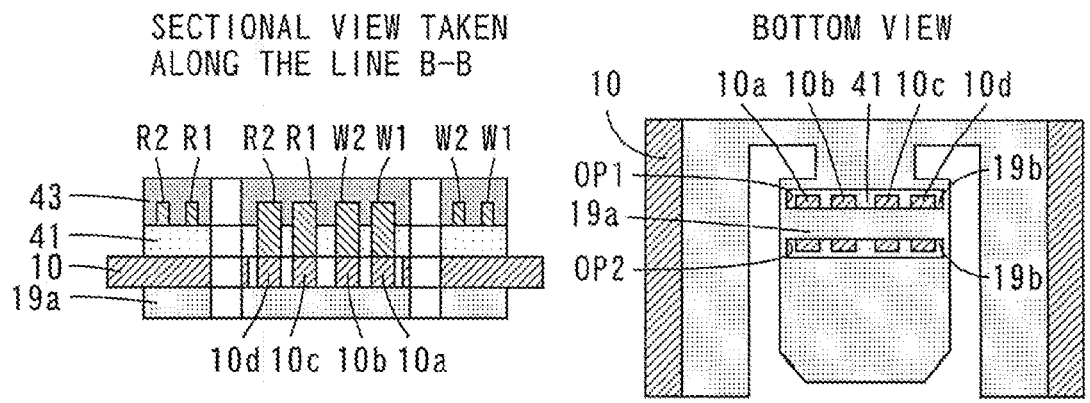
FIGS. 5 (*a*) to 5(*c*) are diagrams showing the steps of manufacturing the suspension board illustrated in FIG. 1.
Figure 5:
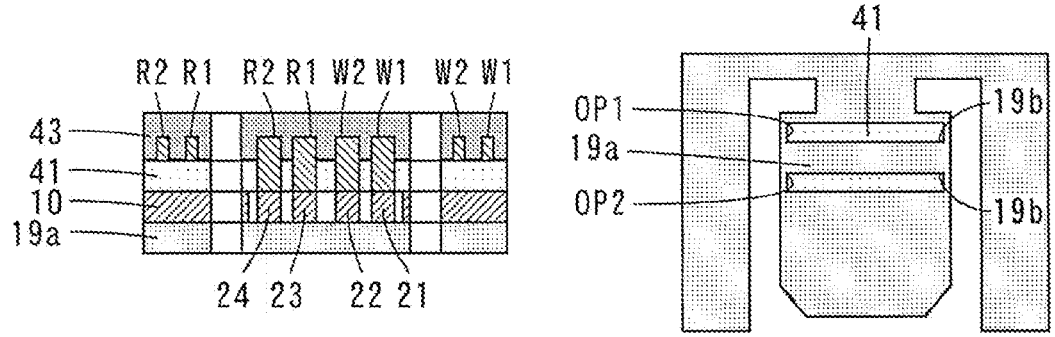
Figure 5:
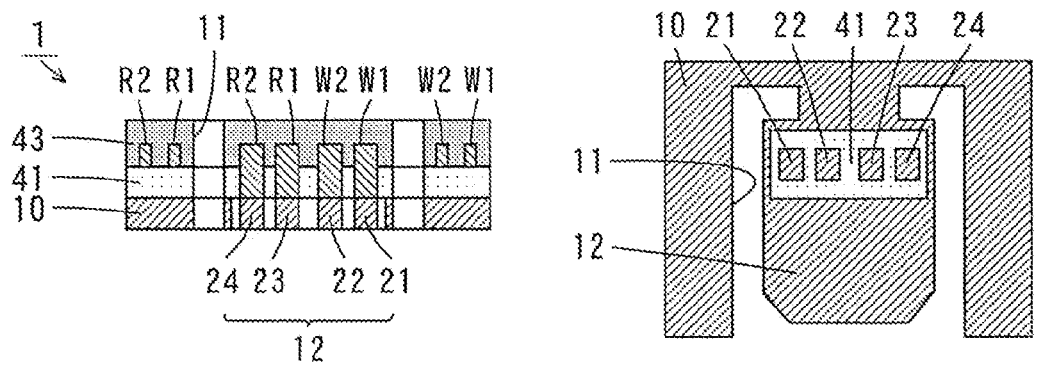

A method of manufacturing the suspension board 1 of FIG. 1 will be described below. FIGS. 3 to 5 are schematic diagrams showing the steps of manufacturing the suspension board 1 of FIG. 1. In FIGS. 3 (a) to 3 (c), cross sectional views taken along the line B-B of the suspension board 1 are shown in the left and top views of the tongue 12 of the suspension board 1 of FIG. 1 and its periphery are shown in the right. In FIGS. 4 (a) to 5 (c), cross sectional views taken along the line B-B of the suspension board 1 of FIG. 1 are shown in the left and bottom views of the tongue 12 and its periphery of the suspension board 1 of FIG. 1 are shown in the right. The same hatched and dotted patterns applied to the members of the cross sectional views are applied to the members of the top view of FIGS. 3 (a) to 3 (c) and the bottom views of FIGS. 4 and 5 in order to facilitate understanding of the configuration.

First, as shown in FIG. 3 (a), the insulating layer 41 made of polyimide is formed on the support substrate 10 made of stainless steel. The thickness of the support substrate 10 is not less than 10 μm nor more than 50 μm, for example. The thickness of the insulating layer 41 is not less than 5 μm nor more than 15 μm, for example. Here, the insulating layer 41 is formed in the same shape as the suspension board 1 of FIG. 1. Further, a plurality of openings 41h (four in the example illustrated in FIG. 3 (a)) are formed in the insulating layer 41. As a result, part of the support substrate 10 is exposed in the openings 41h.

Then, as shown in FIG. 3 (b), the write wiring traces W1 and W2 and the read wiring traces R1 and R2 having predetermined patterns are formed on the insulating layer 41 and the support substrate 10 exposed in the openings 41h. The thickness of each of the write wiring traces W1 and W2 and the read wiring traces R1 and R2 is not less than 6 μm nor more than 18 μm, for example. Further, each of the width of the write wiring traces W1 and W2 and the read wiring traces R1 and R2 is not less than 8 μm nor more than 50 μm, for example. Moreover, each of the spacing between the write wiring traces W1 and W2 and the spacing between the read wiring traces R1 and R2 is not less than 8 μm nor more than 100 μm, for example.

Next, as shown in FIG. 3 (c), a cover layer 43 made of polyimide is formed on the insulating layer 41 to cover the write wiring traces W1 and W2 and the read wiring traces R1 and R2. The thickness of the cover layer 43 is not less than 2 μm nor more than 10 μm, for example.

Then, as shown in FIG. 4 (a), a resist film 18 is formed using a photosensitive dry film resist, for example, on the lower surface of the support substrate 10. Next, as shown in FIG. 4 (b), the resist film 18 is exposed in a predetermined pattern, and then developed by using a development liquid such as sodium carbonate whereby an etching resist 18a is formed. Here, the etching resist 18a has a plurality of (four in the example illustrated in FIG. 4 (b)) rectangular insular parts IR in a rectangular opening OP. Each insular part IR has edges 18b extending in one direction.

Thereafter, as shown in FIG. 4 (c), the support substrate 10 is etched using ferric chloride solution and cupric chloride solution as etching solution, whereby a plurality of conductor traces 10a, 10b, 10c and 10d (four in the example illustrated in FIG. 4 (c)) made of stainless steel are formed on the lower surface of the insulating layer 41. The conductor traces 10a to 10d are electrically connected to the write wiring traces W1 and W2 and the read wiring traces R1 and R2, respectively, and separated from one another.

Each of conductor traces 10a to 10d has a substantially rectangular shape. The four corners of each insular part IR of the etching resist 18a are slightly rounded and the etching solution penetrates beneath the four corners of the etching resist 18a. Therefore, it is difficult to form each corner of the conductor traces 10a to 10d so as to have a radius of curvature of not larger than 35 μm.

Then, after removing the etching resist 18a, as shown in FIG. 4 (d), a resist film 19 is formed using the photosensitive dry film resist, for example, on the lower surfaces of the conductor traces 10a to 10d and the support substrate 10. Next, as shown in FIG. 5 (a), the resist film 19 is exposed in a predetermined pattern, and then developed using the development liquid such as sodium carbonate, whereby the etching resist 19a is formed.

Here, the etching resist 19a has a rectangular opening OP1 that includes the corners on one end of each of the conductor traces 10a to 10d, and a rectangular opening OP2 that includes the corners on the other end of each of the conductor traces 10a to 10d. One side of each of the openings OP1 and OP2 crosses (i.e., in the example of FIG. 5 (a), is orthogonal to) each of the lateral sides of the conductor traces 10a to 10d. This causes both ends of the conductor traces 10a to 10d in a longitudinal direction to be exposed on the etching resist 19a. Further, the other part of the etching resist 19a is formed in the same shape as the suspension board 1 of FIG. 1.

Next, the conductor traces 10a to 10d and the support substrate 10 are etched using the ferric chloride solution and the cupric chloride solution as the etching solution. Here, as shown in FIG. 5 (b), both ends in the longitudinal direction of the conductor traces 10a to 10d are removed. Thereafter, as shown in FIG. 5 (c), the etching resist 19a is removed and then the rectangular connection terminals 21 to 24 are formed. As a result, the suspension board 1 is completed.

In this case, in the step illustrated in FIG. 5 (b), the linear edges 19b of the openings OP1 and OP2 are orthogonal to the lateral sides of the conductor traces 10a to 10d. Further, the etching solution penetrates along the linear edges 19b of the openings OP1 and OP2 of the etching resist 19a. Therefore, the radius of curvature of each corner of the connection terminals 21 to 24 can be not larger than 35 μm. When the connection terminals 21 to 24 are made of stainless steel, the radius of curvature of each corner of each of the connection terminals 21 to 24 is preferably not larger than 30 μm and more preferably 0 μm.

(3) Effect

Figure 6:
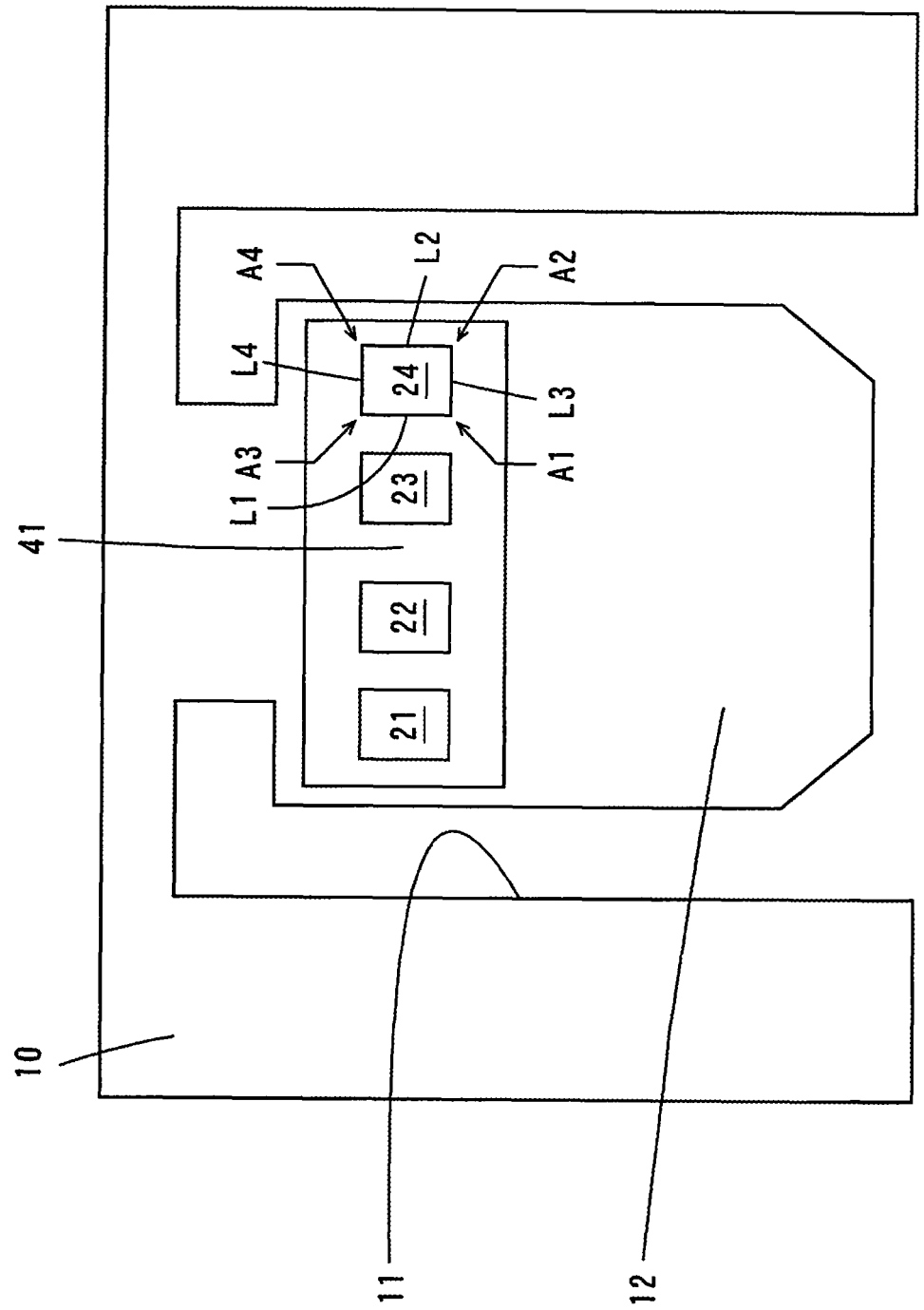
FIG. 6 is an enlarged bottom view showing a tongue of a suspension board and its periphery.

FIG. 6 is an enlarged bottom view showing the tongue 12 of the suspension board 1 and its periphery. Because the insular parts IR of the etching resist 18a of FIG. 4 (b) have the edges 18b arranged in one direction, each of the connection terminals 21 to 24 has two sides L1 and L2 parallel to each other as shown in FIG. 6. Further, because the openings OP1 and OP2 of the etching resist 19a of FIG. 5 (a) have the edges 19b extending in the direction orthogonal to the one direction, each of the connection terminals 21 to 24 has two sides L3 and L4 orthogonal to the sides L1 and L2 as shown in FIG. 6.

A corner A1 is formed between the sides L1 and L3, a corner A2 is formed between the sides L2 and L3, a corner A3 is formed between the sides L1 and L4, and a corner A4 is formed between the sides L2 and L4. The radius of curvature of each corner A1 to A4 is formed to be not larger than 35 μm. That is, each corner A1 to A4 is hardly rounded. Therefore, the reduction of the bonding area of the connection terminals 21 to 24 due to the roundness of the corners A1 to A4 can be suppressed. As a result, this enables the suspension board 1 to be made finer while securing the connection reliability of the connection terminals 21 to 24.

Furthermore, as can be understood from other embodiments described later, because the radius of curvature of the corners A1 to A4 is reduced, the maximum plastic strain of the connection terminals 21 to 24 becomes smaller when stress is applied to the connection terminals 21 to 24.

[2] Second Embodiment

While the connection terminals 21 to 24 are formed to have the radius of curvature of not larger than 35 μm in the first embodiment, the invention is not limited to this. The connection terminals 21 to 24 may be formed such that the radius of curvature of part of the corners is not larger than 35 μm.

FIG. 7 is a schematic diagram showing the steps of manufacturing the suspension board according to the second embodiment. The method of manufacturing suspension board 1 according to the present embodiment has the steps similar to those of the method of manufacturing the suspension board 1 illustrated in FIGS. 3 (a) to 4 (d) according to the first embodiment. Description will be made of the method of manufacturing the suspension board 1 according to the present embodiment by referring to differences from the method of manufacturing the suspension board 1 according to the first embodiment will be described.

Following the step illustrated in FIG. 4 (d), as shown in FIG. 7 (a), the etching resist 19a having a predetermined pattern is formed by processing the resist film 19. Here, the etching resist 19a has the rectangular opening OP2 that includes the corners on one end of each of the conductor traces 10a to 10d. The edges 19b of the opening OP2 cross (i.e., in the example of FIG. 7 (a), is orthogonal to) each of the lateral side of the conductor traces 10a to 10d. This causes one ends of the conductor traces 10a to 10d in the longitudinal direction to be exposed on the etching resist 19a.

Then, the conductor traces 10a to 10d and the support substrate 10 are etched. Here, as shown in FIG. 7 (b), one ends of the conductor traces 10a to 10d in the longitudinal direction are removed. Thereafter, the etching resist 19a is removed, thereby forming the rectangular connection terminals 21 to 24, as shown in FIG. 7 (c). As a result, the suspension board 1 is completed. In this case, the radius of curvature of the corners on the one end side of each of the connection terminals 21 to 24 (the corners A1 and A2 of FIG. 6) can be made to be not larger than 35 μm.

[3] Third Embodiment

Figure 8:
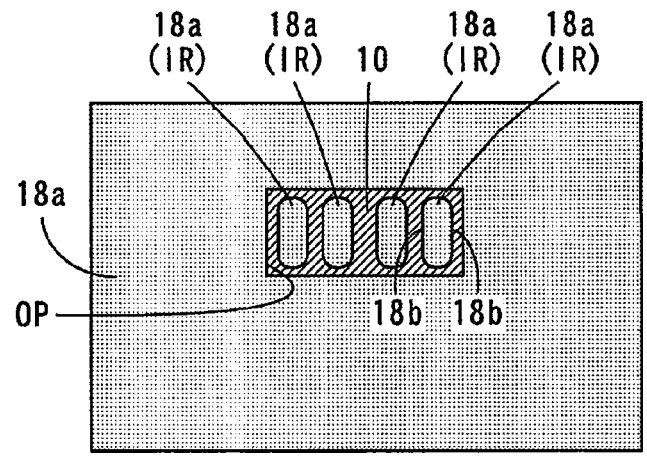
FIG. 8 is a bottom view showing one step of manufacturing a suspension board according to a third embodiment.

While in the step illustrated in FIG. 4 (b) according to the first embodiment, the insular parts IR are formed in a rectangular shape, the invention is not limited to this. The insular parts IR may be formed in another shape that has the edges 18b extending in one direction. FIG. 8 is a bottom view showing the method of manufacturing the suspension board according to the third embodiment.

In the present embodiment, instead of the step illustrated in FIG. 4 (b) in the first embodiment, the etching resist 18a that has a plurality of (four in the example illustrated in FIG. 8) insular parts IR in the rectangular opening OP is formed as shown in FIG. 8. Here, the insular parts IR have the edges 18b extending in the one direction, and both ends of the insular parts IR in a longitudinal direction have semicircular shape. As a result, in the step illustrated in FIG. 4 (c), the conductor traces 10a to 10d with both ends having the semicircular shape in the longitudinal direction are formed.

Thereafter, similarly to the steps illustrated in FIGS. 4 (d) to 5 (c), both ends of the conductor traces 10a to 10d in the longitudinal direction are removed, thereby forming the rectangular connection terminals 21 to 24 that have the corners with their radius of curvature of not larger than 35 μm.

[4] Fourth Embodiment

Figure 9:
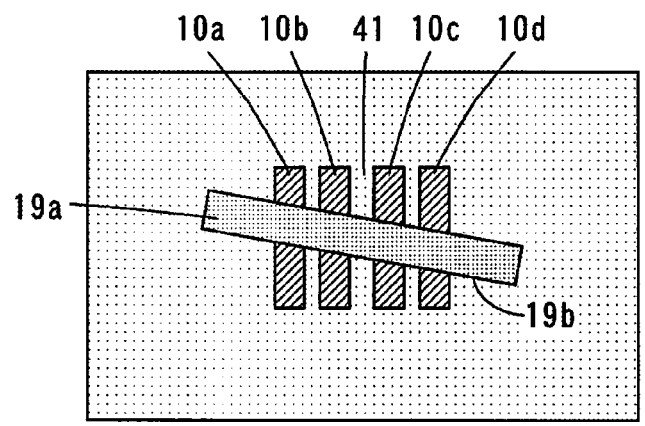
FIGS. 9 (*a*) and 9(*b*) are bottom views showing one step of manufacturing a suspension board according to a fourth embodiment.
Figure 9:
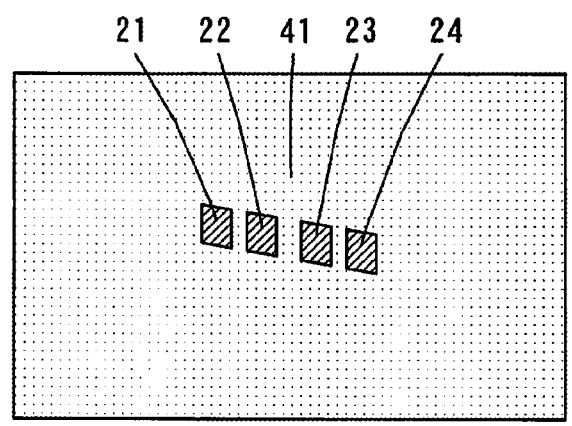

While in the step illustrated in FIG. 5 (a) in the first embodiment, the edges 19b of the etching resist 19a are formed to be orthogonal to each lateral side of each of the conductor traces 10a to 10d, the invention is not limited to this. FIG. 9 is a bottom view showing one step of manufacturing the suspension board according to the fourth embodiment.

In the present embodiment, as shown in FIG. 9 (a), the edges 19b of the etching resist 19a are formed to cross each of the lateral sides of the conductor traces 10a to 10d at a desired angle different from a right angle. In this case, both ends of the conductor traces 10a to 10d in the longitudinal direction are removed and then the etching resist 19a is removed, so that the connection terminals 21 to 24 with an arbitrary quadrangle can be formed as shown in FIG. 9 (b).

[5] Other Embodiments (1) While in the above-mentioned embodiment, the connection terminals 21 to 24 are made of stainless steel, the invention is not limited to this. The connection terminals 21 to 24 may be made of another metal such as copper, gold (Au), silver or aluminum, or alloy such as copper alloy, gold alloy, silver alloy or aluminum alloy. When the connection terminals 21 to 24 are made of copper, the radius of curvature of each corner of each of the connection terminals 21 to 24 is preferably 15 μm, and more preferably not larger than 10 μm and still more preferably 0 μm.

(2) While in the above-mentioned embodiment, all of the connection terminals 21 to 24 are formed to have the corners with the radius of curvature of not larger than 35 μm, the invention is not limited to this. Part of the connection terminals 21 to 24 may be formed to have the corners with a radius of curvature of not larger than 35 μm.

(3) While in the above-mentioned embodiment, the conductor traces 10a to 10d are formed by etching using the etching resist 18a, the invention is not limited to this. The conductor traces 10a to 10d may be formed by other methods such as a semi-additive method or the like.

(4) While in the above-mentioned embodiment, the connection terminals 21 to 24 are formed on the lower surface of the suspension board 1, the invention is not limited to this. The connection terminals 21 to 24 may be formed on the upper surface of the suspension board 1.

(5) In the suspension board 1 of FIG. 1, part or all of the connection terminals 31 to 34 may be manufactured similarly to the method of manufacturing the connection terminals 21 to 24 in the first to fourth embodiments. Further, the connection terminals 31 to 34 may be formed on the lower or upper surface of the suspension board 1.

[6] Correspondences Between Elements in the Claims and Parts in Embodiments

In the following paragraphs, non-limiting examples of correspondences between various elements recited in the claims below and those described above with respect to various preferred embodiments of the present invention are explained.

The insulating layer 41 is an example of an insulating layer, the read wiring traces R1 and R2 or the write wiring traces W1 and W2 are examples of a wiring trace, the connection terminals 21 to 24 are examples of a connection terminal, the corners A1 to A4 are examples of a corner, the suspension board 1 is an example of a printed circuit board, the sides L1 to L3 are examples of first to third sides respectively, the corners A1 and A2 are examples of first and second corners respectively, and the etching resists 19a and 18a are examples of first and second etching resists respectively.

As each of various elements recited in the claims, various other elements having configurations or functions described in the claims can be also used.

[7] Inventive Examples

In inventive examples 1 to 4 and a comparative example 1 described below, the maximum plastic strain was evaluated by simulation after stress was applied to a plurality of connection terminals with the corners that were made of stainless steel and had different radii of curvature. The results are shown in Table 1. Here, the connection terminals according to the inventive examples 1 to 4 and the comparative example 1 had a 50 μm-wide squareshape. Further, the radii of curvature of the corners of the connection terminals according to the inventive examples 1 to 4 and the comparative example 1 were respectively 0 μm, 10 μm, 20 μm, 30 μm and 50 μm.

TABLE 1

| | RADIUS OF CURVATURE OF CORNER | MAXIMUM PLASTIC STRAIN |
|---|---|---|
| INVENTIVE EXAMPLE 1 | 0 μm | 0.0092 |
| INVENTIVE EXAMPLE 2 | 10 μm | 0.0093 |
| INVENTIVE EXAMPLE 3 | 20 μm | 0.0093 |
| INVENTIVE EXAMPLE 4 | 30 μm | 0.0124 |
| COMPARATIVE EXAMPLE 1 | 50 μm | 0.0163 |

As shown in Table 1, the maximum plastic strains of the connection terminals according to the inventive examples 1 to 3 were respectively 0.0092, 0.0093 and 0.0093. Further, the maximum plastic strain of the connection terminals according to the inventive example 4 was 0.0124. On the other hand, the maximum plastic strain of the connection terminals according to the comparative example 1 was 0.0163.

From the results in the inventive examples 1 to 4 and the comparative example 1, it was confirmed that when the connection terminals were made of stainless steel and had a 50 μm-wide squareshape, the increase in the maximum plastic strain was suppressed by setting the radius of curvature of the corners to be not larger than 30 μm. In particular, it was confirmed that the increase in the maximum plastic strain was largely suppressed by setting the radius of curvature of the corners to be not larger than 20 μm.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. A printed circuit board comprising:
an insulating layer having a first surface and an opposing second surface, the first and second surfaces extending parallel to each other;
a wiring trace formed on the first surface of said insulating layer; and
a connection terminal made of conductor that is electrically connected to said wiring trace,
wherein said connection terminal has a bonding surface extending parallel to the first surface of said insulating layer, the bonding surface having first and second sides parallel to each other and a third side orthogonal to the first and second sides, a width between the first and second sides being not larger than 70 μm, and
wherein the bonding surface has at least one corner with a radius of curvature of not larger than 35 μm when the bonding surface is viewed in a direction extending perpendicular to the bonding surface, the at least one corner including a first corner that is formed by the first and third sides.

2. The printed circuit board according to claim 1, wherein said conductor includes stainless steel, and
the radius of curvature of said at least one corner of said bonding surface of said connection terminal is not larger than 30 μm.

3. The printed circuit board according to claim 1, wherein said conductor includes copper, and
the radius of curvature of said at least one corner of said bonding surface of said connection terminal is not larger than 10 μm.

4. The printed circuit board according to claim 1, wherein said at least one corner further includes a second corner that is formed by said second and third sides.

5. The printed circuit board according to claim 1, wherein said connection terminal is configured to be electrically connectable to a magnetic head, and transmittable of an electrical signal between said magnetic head and an electronic circuit through said wiring trace and said connection terminal.

6. A connection terminal that is to be electrically connected to a wiring trace to transmit an electrical signal, the connection terminal comprising:
a bonding surface that is to be bonded to an electronic component, the bonding surface having first and second sides parallel to each other and a third side orthogonal to the first and second sides, a width between the first and second sides being not larger than 70 μM, the bonding surface having at least one corner having a radius of curvature of not larger than 35 μm when the bonding surface is viewed in a direction perpendicular to the bonding surface, the at least one corner being formed by the first and third sides.

7. A printed circuit board comprising:

an insulating layer having a first surface and an opposing second surface, the first and second surfaces extending parallel to each other;

a wiring trace formed on the first surface of said insulating layer; and a connection terminal made of conductor that is electrically connected to said wiring trace, the connection terminal having:

a first surface formed on the second surface of the insulating layer, and an opposing second surface which extends parallel to the first surface of the connection terminal and which is a bonding surface, the bonding surface being spaced apart from the insulating layer, wherein the bonding surface has first and second sides which extend parallel to each other and a third side which extends orthogonal to the first and second sides, a width between the first and second sides being not larger than 70 μm, and wherein the bonding surface includes at least one corner formed by the first and third sides and having a radius of curvature of not larger than 35 μm.

* * * * *